United States Patent
Kye et al.

(10) Patent No.: US 6,829,040 B1
(45) Date of Patent: Dec. 7, 2004

(54) LITHOGRAPHY CONTRAST ENHANCEMENT TECHNIQUE BY VARYING FOCUS WITH WAVELENGTH MODULATION

(75) Inventors: Jongwook Kye, Pleasanton, CA (US); Ivan Lalovic, Mountain View, CA (US); Christopher F. Lyons, Fremont, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/703,643

(22) Filed: Nov. 7, 2003

(51) Int. Cl.[7] .............................................. G03B 27/42
(52) U.S. Cl. .......................... 355/53; 355/67; 355/77; 430/311; 372/23
(58) Field of Search .......................... 355/53, 55, 67, 355/77; 430/311; 373/20, 23

(56) References Cited

U.S. PATENT DOCUMENTS

| | | | |
|---|---|---|---|
| 4,869,999 A | 9/1989 | Fukuda et al. | 430/311 |
| 4,904,569 A | 2/1990 | Fukuda et al. | 430/311 |
| 4,937,619 A | 6/1990 | Fukuda et al. | 355/53 |
| 4,992,825 A | 2/1991 | Fukuda et al. | 355/53 |
| 5,194,893 A | 3/1993 | Nishi | 355/53 |
| 5,303,002 A | 4/1994 | Yan | 355/53 |
| 5,483,311 A | 1/1996 | Sakakibara et al. | 355/53 |
| 5,742,376 A | 4/1998 | Makinouchi | 355/53 |
| 6,081,332 A | * 6/2000 | Kojima | 356/334 |
| 6,501,534 B1 | 12/2002 | Singh et al. | 355/55 |
| 2002/0048288 A1 | 4/2002 | Kroyan et al. | 372/20 |
| 2002/0167975 A1 | 11/2002 | Spangler et al. | 372/20 |

OTHER PUBLICATIONS

Palmer, Christopher; Diffraction Grating Handbook, 5th Edition, Chapter 6 (2002).

Spectra–Physics, Lasers and Photonics, 2003.

* cited by examiner

*Primary Examiner*—D. Rutledge
(74) *Attorney, Agent, or Firm*—Renner, Otto, Boisselle & Sklar, LLP

(57) ABSTRACT

A projection lithography system exposes a photo sensitive material on a surface of a semiconductor substrate that includes surface height variations between a high level and a low level. The system comprises an illumination source projecting illumination within a narrow wavelength band centered about a nominal wavelength on an optic path towards the substrate during an exposure period. A wavelength modulation system within the optic path comprises means for chromatically separating the narrow wavelength band into at least two sub-bands, the first sub-band being smaller than the narrow wavelength band and centered about a first sub-band wavelength and the second sub-band being smaller than the narrow wavelength band and centered about a second sub-band wavelength and means for passing each of the first sub-band and the second sub-band during distinct time periods within the exposure period.

18 Claims, 5 Drawing Sheets

LITHOGRAPHY CONTRAST ENHANCEMENT TECHNIQUE BY VARYING FOCUS WITH WAVELENGTH MODULATION

TECHNICAL FIELD

The present invention relates generally to fabrication of a semiconductor device and more particularly to a system and a method for projecting patterned illumination through a lens system with a large numeric aperture with improved contrast over an expanded depth.

BACKGROUND OF THE INVENTION

Optical lithography is a well known process for fabricating structures on a semiconductor substrate. Lithography includes applying a photosensitive material known as a photoresist on the surface of a wafer that is the subject of the fabrication. Illumination is then projected through a patterned reticle to form an image on the photosensitive material.

A reticle comprises a transparent material that includes an opaque layer representing an integrated circuit pattern (either in a positive or negative) to be imaged onto the photosensitive material.

The illumination causes a chemical reaction within the photoresist such that its solubility characteristics are altered. If the photosensitive material is a photoresist known as a positive photoresist, the portions exposed to illumination become soluble to a developer solution while unexposed portions remain relatively insoluble. If the photosensitive material is a photoresist known as a negative photoresist, the exposed portions become relatively insoluble to the developer while the unexposed portions remain soluble.

After the photoresist is exposed to illumination, the substrate is washed with a developer to remove the soluble photoresist and expose the underlying substrate or previously fabricated structures (e.g. the topography) such that the integrated circuit pattern of the reticle exists in the form of insoluble photoresist over the topography.

Thereafter, the exposed topography is etched using chemical compounds selective between the insoluble photoresist and the exposed materials to be etched.

It is a well known goal to continually reduce feature size of integrated circuits. A reduction in feature size requires an improvement in resolution of the projected image. It is well known that resolution is proportional to the wavelength of illumination divided by the numerical aperture of the projection optics. More specifically, resolution at an image plane can be improved by using a shorter wavelength illumination and using projection optics with a higher numeric aperture. For example, referring to FIG. 1, a smaller pattern size (better resolution) can be achieved at the image plane using large numeric aperture projection optics as represented by curve 12 while lower resolution is achieved at the image plane using smaller numeric aperture projection optics as represented by curve 16.

A problem with large numeric aperture projection optics is that the depth of focus is worse than small numeric aperture projection optics. More specifically, at a particular variance from the image plane, the resolution of a small numeric aperture projection optic may be better than the resolution of a large numeric aperture projection optic.

For example, referring again to FIG. 1, if a variation from the image plane increases (as represented by the vertical axis 18), a small numeric aperture projection optic maintains its resolution (as represented by curve 16) better than a large numeric aperture optic maintains its resolution (as represented by curve 12). Or stated another way, the resolution of the large numeric aperture optic "falls-off" or degrades more rapidly with respect to deviation from the image plane than does a small numeric aperture optic.

Depth of focus is a concern for lithography processes. Integrated circuit structures may deviate in height from the nominal surface of the substrate. As such, the photoresist onto which the reticle pattern is to be imaged is not planar, but instead has a deep topography. This results in only a portion of the photoresist being at the image plane.

The depth of the topography limits use of a large numeric aperture projection optic. While a large numeric aperture projection optic may provide an improvement in resolution at the image plane, the image resolution will be worse than a smaller numeric aperture projection optic at topographies that deviate from the image plane.

To enable use of larger numeric aperture projection optics to improve resolution at the image plane and to accommodate the resolution degradation at topographies that deviate from the image plane, a method known as focus latitude enhancement exposure (FLEX) has been developed.

FLEX requires breaking the exposure period into multiple sub-exposure periods and varying the image plane with respect to the surface topography for each sub-exposure period. More specifically, the distance between the projection optics and the surface topography is varied for each sub-exposure period. This results in the entire exposure period consisting of an aggregation of each sub-exposure period.

FLEX operates on the principal that the contrast is best within a small depth deviation from the image plane while there exists very little contrast variations at large deviations form the image plane, the aggregate of multiple sub-exposures will create contrast at large deviations from the image plane that approximate the contrast at the image plane.

A problem with FLEX is that breaking an exposure period into multiple sub exposure periods requires a significantly longer overall time period. Between each sub-exposure period, the illumination must be turned off, the distance between the projection optics and the wafer adjusted, and the illumination turned back on to initiate the next sub-exposure period.

Therefore, what is needed is a photolithography system that provides the advantages of FLEX but does not suffer the disadvantages of operating a FLEX system.

SUMMARY OF THE INVENTION

A first aspect of the present invention is to provide a projection lithography system for exposing a photo sensitive material on a surface of a semiconductor substrate that includes surface height variations between a high level and a low level.

The projection lithography system comprises an illumination source projecting illumination within a narrow wavelength band (on the order of one Pico meter in width) centered about a nominal wavelength on an optic path towards the substrate during an exposure period.

A wavelength modulation system is positioned within the optic path and comprises means for chromatically separating the narrow wavelength band into at least two sub-bands. The first sub-band is smaller than the narrow wavelength band and is centered about a first sub-band wavelength. The second sub-band is smaller than the narrow wavelength band and is centered about a second sub-band wavelength.

The wavelength modulation system also comprises means for passing each of the first sub-band and the second sub-band during distinct time periods within the exposure period.

A patterned mask is also positioned within the optic path. A lens within the optic path focuses an image of the patterned mask onto the photosensitive material. The lens has chromatic aberration characteristics that provide for: i) focusing the image of the patterned mask at the low level when the first wavelength band is passed through the wavelength modulation system; and ii) focusing the image of the patterned mask at the high level when the second wavelength band is passed through the wavelength modulation system.

More specifically, the chromatic aberration characteristic may result in a deviation of 200 nm to 500 nm in the level at which the lens focuses the image of the patterned mask as a result of a 1 pm wavelength deviation of the illumination.

The illumination source may be a laser powered by an illumination driver, the illumination drive may pulse the laser at a frequency that is a multiple of the frequency of the continuous sinusoidal function.

The wavelength modulation system may be positioned within the optic path between the illumination source and the mask. The wavelength modulation system may vary the sub-band passed between the first sub-band and the second sub-band in a continuous sinusoidal function repeating at a frequency on the order of one kilohertz.

In a first embodiment, the wavelength modulation system comprises: i) a diffraction grating that chromatically separates the narrow wavelength band into the first wavelength band and the second wavelength band; and ii) a motor rotating the diffraction grating vary the alignment of the first wavelength band and the second wavelength band with respect to an exit slit to pass a continually varying portion of the chromatically separated illumination through the exit slit.

In a second embodiment, the wavelength modulation system comprises: i) a photo elastic crystal within the optic path to chromatically separate the illumination into the first wavelength band and the second wavelength band; and ii) a piezo electric transducer secured to the crystal for propagating sound waves through the crystal in a direction oblique to the optic path. The propagating sound waves vary the alignment of the first wavelength band and the second wavelength band with respect to an exit slit such that a continually varying portion of the chromatically separated illumination passes through the exit slit.

In a third embodiment, the wavelength modulation system comprises: i) a prism within the optic path with at least one of an entry surface and an exit surface that is oblique to the optic path for chromatically separating the illumination into the first wavelength band and the second wavelength band at the exit surface; and ii) a motion driver is secured to the prism for moving the prism to vary the alignment of the first wavelength band and the second wavelength band with respect to an exit slit such that a continually varying portion of the chromatically separated illumination passes through the exit slit.

For a better understanding of the present invention, together with other and further aspects thereof, reference is made to the following description, taken in conjunction with the accompanying drawings. The scope of the invention is set forth in the appended claims.

DESCRIPTION OF THE PREFERRED EMBODIMENTS

Figure 1:
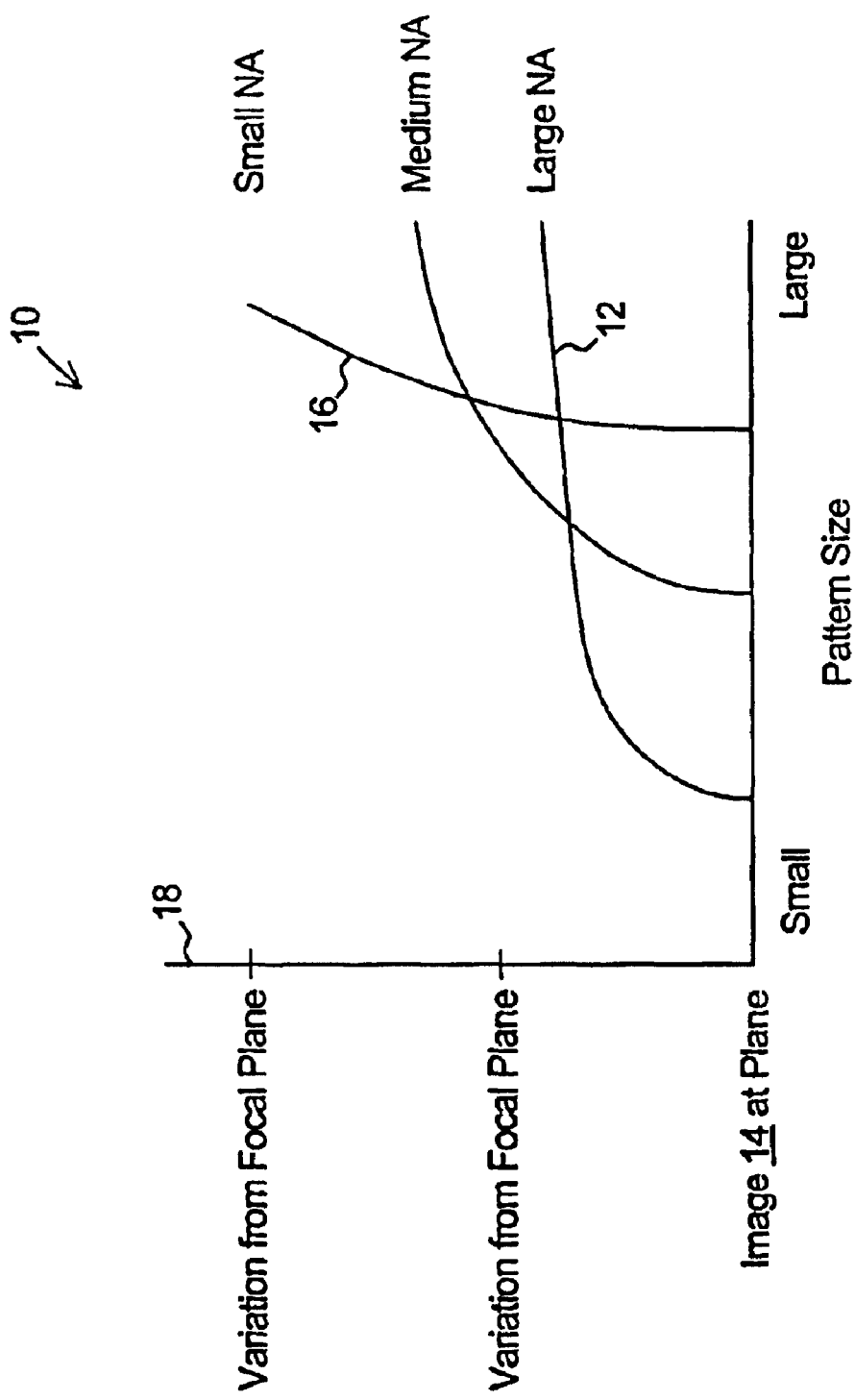
FIG. 1 is a graph representing the impact of numerical aperture and variation from focal plane on resolution.

The present invention will now be described in detail with reference to the drawings. In the drawings, like reference numerals are used to refer to like elements throughout.

Figure 2:
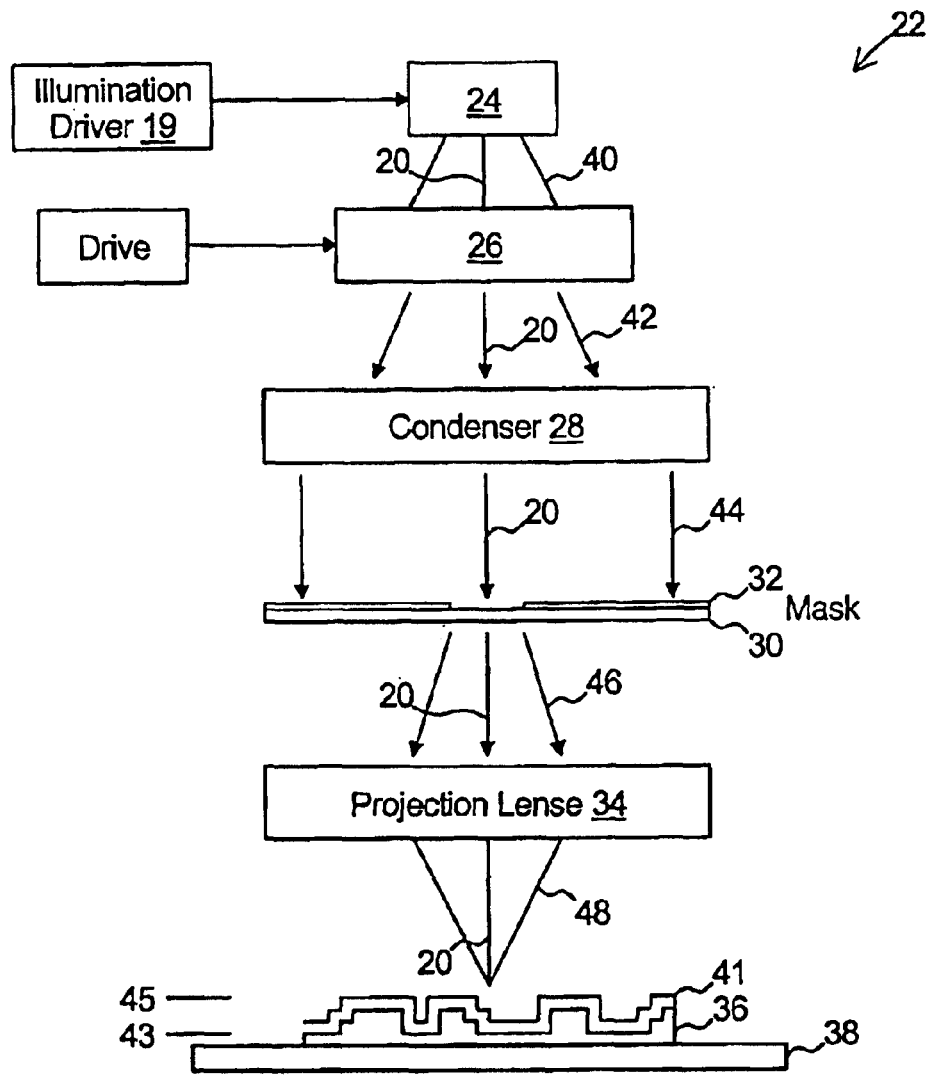
FIG. 2 is a diagram representing an exemplary projection lithography system in accordance with one embodiment of the present invention.

Referring to FIG. 2, a first embodiment of a projection lithography system 22 of the present invention is represented. The projection lithography system 22 comprises an illumination source 24, an illumination modulation system 26, a condenser lens 28, a mask 32 patterned onto a transparent substrate 30, a projection lens 34, and a stage 38. In combination, the above elements operate to project an image of the mask 32 onto a photosensitive material 31 on a surface of a semiconductor substrate 36 which is secured to the stage 38.

More specifically, the surface of the semiconductor substrate 36 and the photosensitive material 41 thereon may have surface height variations that vary between a high level 45 and a low level 43. The above elements operate to project an image of the mask 32 at multiple image planes that coincide with the high level 45, the low level 43, and multiple levels there between.

The illumination source 24 may be a laser. Exemplary illumination sources comprise: i) an XeCl excimer laser producing illumination at a nominal wavelength of 308 nm; and ii) a KrF excimer laser producing illumination at a nominal frequency of 248 nm. In the exemplary embodiment, the illumination source 24 outputs illumination 40 along an optic path 20 towards the semiconductor substrate 36.

In the exemplary embodiment, the illumination source is driven at a pulse frequency by an illumination driver 19 to modulate the output intensity of the illumination source 24. The illumination driver 19 may be a known system for driving the illumination source 24 at a pulse frequency that is a multiple of a frequency used to drive the illumination modulation system 26 (discussed below). In the exemplary embodiment, the illumination driver 19 drives the illumination source 24 at a pulse frequency selected from a group of pulse frequencies consisting of 1 Khz, 2 Khz, or 4 Khz.

Figure 3:
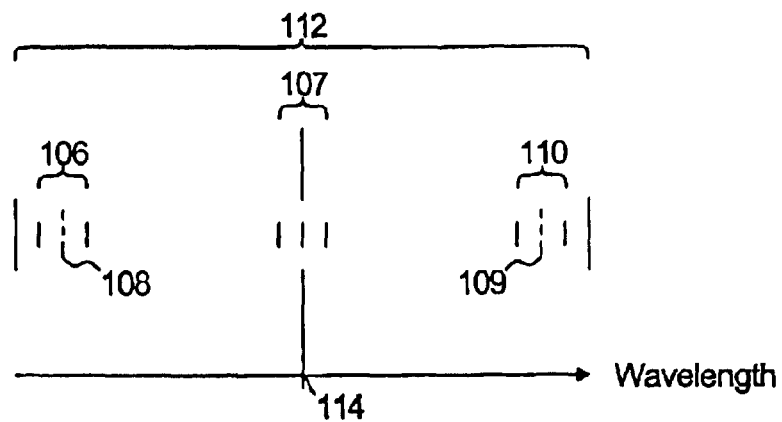
FIG. 3 is a diagram representing multiple sub-bands within a narrow band of illumination in accordance with one embodiment of the present invention

Referring briefly to FIG. 3, the illumination 40 output by the laser illumination source 24 is within a narrow wavelength band 112 approximately one Pico-meter and centered at a nominal wavelength 114 of: i) 308 nm if illumination source 24 is the exemplary XeCl excimer laser; or ii) 248 nm if the illumination source 24 is the exemplary KrF excimer laser.

Referring to FIG. 2 in conjunction n with FIG. 3, the illumination modulation system 26 is positioned within the optical path 20 and receives the illumination 40. The illumination modulation system 26 operates to chromatically separate the narrow wavelength band and to pass only a fraction of the narrow wavelength band 112 at any particular instant in time. The fraction passed is varied during an exposure period such that during a first portion of the exposure period a first portion (or sub-band) 106 of the narrow wavelength band 112 is passed and during a second portion of the exposure period a second portion (or sub-band) 110 of the narrow wavelength band 112 is passed. The first portion 106 of the narrow wavelength band 112 and the second portion 110 of the narrow wavelength band are mutually exclusive.

The narrow wavelength band 112 comprises a plurality of smaller wavelength sub-bands which are chromatically separated. For example wavelength sub-band 106 is centered at wavelength 108, wavelength sub-band 107 is centered at wavelength 114, and wavelength sub-band 110 centered at wavelength 109. All of sub-bands 106, 107, 108 are smaller than the narrow wavelength band 112, of approximately equal width, and entirely within the wavelength band 112.

Figure 4:
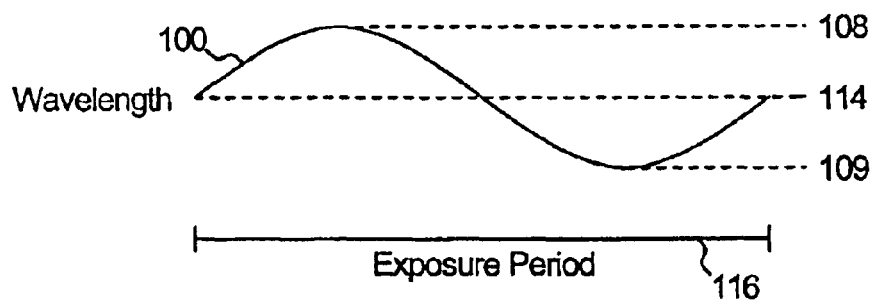
FIG. 4 is a diagram representing the center wavelength of the sub-band passed as a continuous function of time in accordance with one embodiment of the present invention.

Referring briefly to FIG. 4, the illumination modulation system 26 may vary the wavelength sub-band that is passed on as a continuous function of time during the exposure period 116 such as the sinusoidal function 100 shown. The sinusoidal function 100 represents the wavelength at the center of the sub-band passed as a function of time during the exposure period 116. The sinusoidal function 100 varies between the center wavelength 108 of sub-band 106 and the center wavelength 109 of sub-band 110. Specific embodiments of the wavelength modulation system 26 are discussed later herein.

The wavelength modulated illumination 42 passed by the illumination modulation system 26 is directed towards a condenser lens 28. The condenser lens 28 may be a known lens system in the art of projection lithography for configuring its output illumination 44 for projection through the mask 32.

The mask 32 and the substrate 30 may be any known mask technology used for projection lithography. In one exemplary embodiment, the mask 32 is a patterned chromium compound on a glass substrate 30 that is several times larger than the pattern to be projected onto the photoresist 41 such that the output illumination of the mask 32 is patterned illumination 46.

The patterned illumination 46 is directed towards the projection lens 34. The projection lens 34 is a lens system known in the art of projection lithography for focusing an image of the mask 32 at an image plane that coincides with a plane of the photoresist 41 and is of a size that matches the size of the circuit to be formed on the underlying substrate 36.

Figure 5:
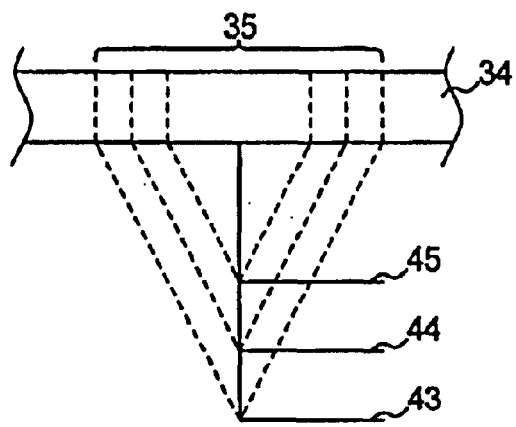
FIG. 5 is a diagram representing a change in focal depth due to a change in wavelength in accordance with one embodiment of the present invention.

The projection lens 34 will have chromatic aberration. Referring briefly to FIG. 5, in the exemplary embodiment, the chromatic aberration will be such that one Pico meter of wavelength deviation will cause an image plane shift between approximately 200 nm and 500 nm. For example, illumination projected through the projection lens 34, when the first sub-band 106 is passed, with a wavelength centered at wavelength 108, will focus an image plane 45. Illumination projected through the projection lens 34, when the sub-band 107 is passed, with a wavelength centered at wavelength 114, will focus an image plane 44. Illumination projected through the projection lens 34, when the sub-band 110 is passed, with a wavelength centered at wavelength 109, will focus an image plane 43.

Figure 6:
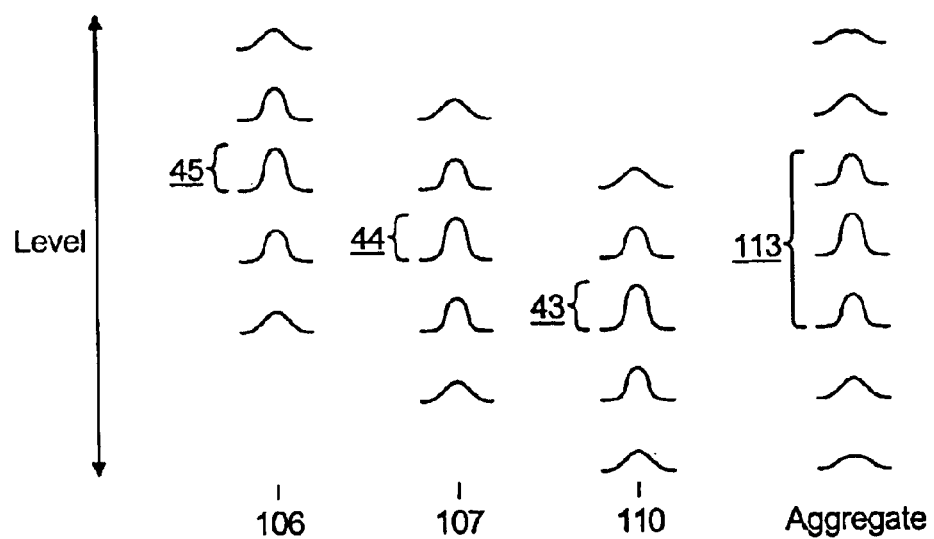
FIG. 6 is a diagram representing the aggregation of multiple exposures with varying focal depth in accordance with one embodiment of the present invention.
Figure 7:
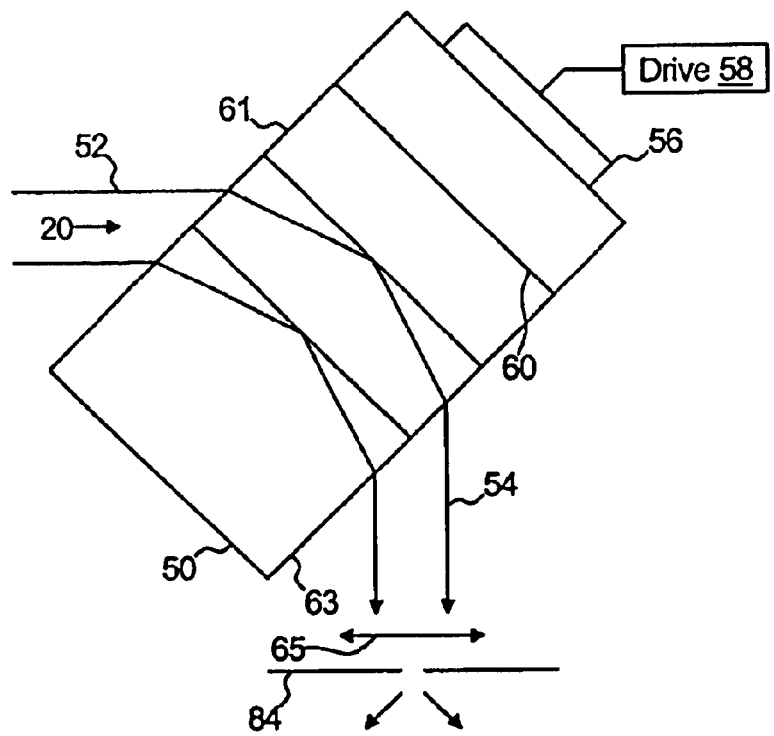
FIG. 7 is a diagram representing a first embodiment of a wavelength modulation system in accordance with the present invention.

As such, when the illumination modulation system 26 varies the sub-band passed, the level at which the image plane is focused, with respect to the projection lens 34 and the substrate 36 will vary. Referring to FIG. 6, when the illumination modulation system 26 passes sub-band 106, the image plane will focus at the high level 45 and therefore the image contrast will be greatest at level 45 while contrast is diminished at level deviations from level 45. When sub-band 107 is passed, the image plane will focus at level 44 and therefore the image contrast will be greatest at level 44 while contrast is diminished at level deviations from level 44. When sub-band 110 is passed, the image plane will focus at the low level 43 and therefore the image contrast will be greatest at level 43 while contrast is diminished at level deviations from level 43.

When all three sub-bands are passed during distinct time periods of the exposure period, the aggregate illumination passed has a high contrast level through a level range 113 that spans between the high level 45 and the low level 43.

Referring to FIG. 3, a first embodiment of the illumination modulation system 26 is shown. The first embodiment of the illumination modulation system 26 operates on the principal that a sound wave 60 propagated within a photo-elastic crystal 50 will modify the refractive index of the crystal 50 at the wave fronts thereby creating a moving—or propagating diffraction grating.

A piezo electric transducer 56 is adhered to a first surface of the crystal 50 that is generally perpendicular to an entry surface 61 and an exit surface 63. A drive circuit 58 applies a sinusoidal drive function to the transducer 56 to establish the sound wave 60 within the crystal 50. As such, the sound wave 60 moves generally perpendicular to the entry surface 61 and the exit surface 63.

Illumination 20 from the illumination module 24 enters the crystal 50 at the entry surface 61 at an oblique angle to the entry surface 61. Because the refractive index of the crystal 50 is greater than the atmosphere, the illumination is refracted towards the normal and chromatically separated. The varied index of refraction caused by the sound wave 60 causes a total internal reflection phenomena at the sound wave fronts. After the internal reflection, the chromatically separated illumination 54 leaves the crystal at the exit surface 63. The chromatically separated illumination 54 is directed towards and exit slit 84.

The propagating sound waves will cause each wavelength of the chromatically separated illumination 42 to oscillate in direction 65. As such, the wavelength of the portion of the illumination 54 that passes through the exit slit 84 will vary at the same frequency at which the drive 58 propagates the sound waves within the crystal 50.

In the exemplary embodiment, the drive 58 propagates the sound waves within the crystal at a frequency on the order of one kilo hertz.

Figure 8:
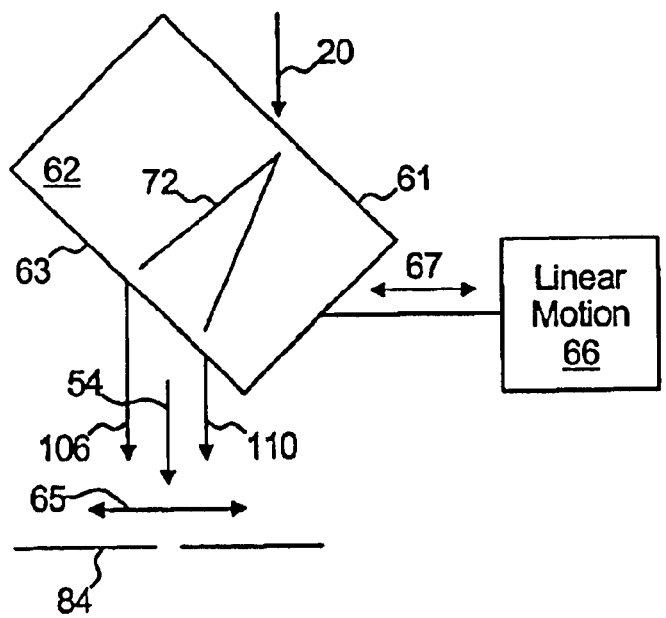
FIG. 8 is a diagram representing a second embodiment of a wavelength modulation system in accordance with the present invention.

Referring to FIG. 8, a second embodiment of the illumination modulation system 26 is shown. The second embodiment of the illumination modulation system 26 operates on the principal that a prism 63 will refract each wavelength of illumination differently and chromatically separate illumination.

Illumination 20 from the illumination module 24 enters the crystal 50 at the entry surface 61 at an oblique angle to the entry surface 61. Because the refractive index of the crystal 50 is greater than the atmosphere, the illumination is refracted towards the normal with chromatic separation. At the exit surface, the illumination is further chromatically separated. The chromatically separated illumination 54 is directed towards and exit slit 85.

A linear motion device 66 is secured to the crystal 62 to oscillate the crystal in direction 67. The oscillating motion of the crystal 50 will cause each wavelength of the chromatically separated illumination 42 to oscillate in direction 65. As such, the wavelength of the portion of the illumination 54 that passes through the exit slit 84 will vary at the same frequency at which the linear motion device 66 oscillates the prism 62.

In the exemplary embodiment, the linear motion device 66 oscillates the prism at a frequency on the order of one kilo hertz.

Figure 9:
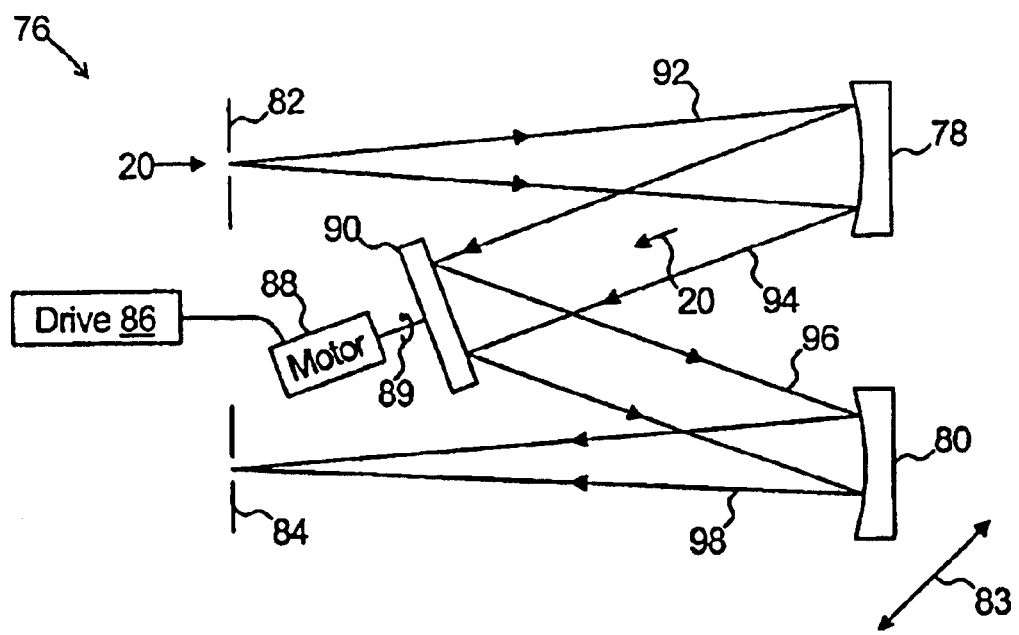
FIG. 9 is a diagram representing a third embodiment of a wavelength modulation system in accordance with the present invention.

Referring to FIG. 9, a third embodiment of the illumination modulation system 26 is shown. The third embodiment of the illumination modulation system 26 operates on the principal that a diffraction grating will chromatically separate illumination.

The illumination 20 from the illumination source 24 is directed towards an entry slit 82. The illumination 92 diverging from entry slit 82 is directed towards a first concave mirror 78 which condenses the divergence and redirects the illumination 92 towards a diffraction grating 90 as non-diverging illumination 94.

The diffraction grating 90 is positioned normal to the illumination 94 and chromatically separates the illumination 94 to generate chromatically separated illumination 96. The chromatically separated illumination 96 from the diffraction grating 90 is directed to a second concave mirror 80. The second concave mirror reflects the illumination 96 in a converging pattern 98 towards an exit slit 84.

The diffraction grating 90 is coupled to a motor 88 by a shaft 89. The motor 88 is driven by a drive circuit 86 which causes the diffraction grating 90 to rotate about an axis 89 defined by one of the incident illumination 94 or the chromatically separated illumination 96. As the diffraction grating 90 rotates about the axis 89 each wavelength of the chromatically separated illumination 96 will oscillate along direction 83. As such, the wavelength of the portion of the illumination 96 that passes through the exit slit 84 will vary at the same frequency at which the drive circuit 86 spins or oscillates the diffraction grating 90.

In the exemplary embodiment, the drive circuit 86 provides for the motor to at least one of rotate and oscillate at a rate that provides for the chromatically separated illumination to oscillate at a frequency on the order of one kilo hertz.

Although the system of the present invention dielectric has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A projection lithography system for exposing a photo sensitive material on a surface of a semiconductor substrate that includes surface height variations between a high level and a low level, the projection lithography system comprising:

an illumination source projecting illumination within a narrow wavelength band centered about a nominal wavelength on an optic path towards the substrate during an exposure period;

a wavelength modulation system within the optic path comprising:

means for chromatically separating the narrow wavelength band into at least two sub-bands, the first sub-band being smaller than the narrow wavelength band and centered about a first sub-band wavelength and the second sub-band being smaller than the narrow wavelength band and centered about a second sub-band wavelength; and means for passing each of the first sub-band and the second sub-band during distinct time periods within the exposure period a patterned mask within the optic path;

a lens within the optic path for focusing an image of the patterned mask onto the photosensitive material, the lens having chromatic aberration characteristics that provide for:

focusing the image of the patterned mask at the low level when the first wavelength band is passed through the wavelength modulation system; and focusing the image of the patterned mask at the high level when the second wavelength band is passed through the wavelength modulation system.

2. The projection lithography system of claim 1, wherein the chromatic aberration characteristic results in deviation of 200 nm to 500 nm in the level at which the lens focuses the image of the patterned mask as a result of a 1 pm wavelength deviation of the illumination.

3. The projection lithography system of claim 2, wherein:

the wavelength modulation system varies the sub-band passed between the first sub-band and the second sub-band in a continuous function repeating at a frequency on the order of one kilohertz.

4. The projection lithography system of claim 3, wherein the illumination source is a laser powered by an illumination driver, the illumination driver pulsing the laser at a frequency that is a multiple of the frequency of the continuous function.

5. The projection lithography system of claim 4, wherein the narrow wavelength band has a width on the order of 1 Pico-meter.

6. The projection lithography system of claim 5, wherein:

the wavelength modulation system is positioned within the optic path between the illumination source and the mask.

7. The projection lithography system of claim 6, wherein the wavelength modulation system comprises a diffraction grating that rotates about an axis defined by the optic path.

8. The projection lithography system of claim 6, wherein the wavelength modulation system comprises:

a photo elastic crystal within the optic path;

a piezo electric transducer secured to the crystal for propagating sound waves through the crystal in a direction oblique to the optic path.

9. The projection lithography system of claim 6, wherein the wavelength modulation system comprises:

a prism within the optic path with at least one of an entry surface and an exit surface that is oblique to the optic path for separating the first wavelength band and the second wavelength band at the exit surface;

a motion driver secured to the prism for moving the prism to vary the alignment of the first wavelength band and the second wavelength band at the exit surface with the optic path.

10. A method of exposing a photo sensitive material on a surface of a semiconductor substrate that includes surface height variations between a high level and a low level, the method comprising:

projecting illumination within a narrow wavelength band centered about a nominal wavelength on an optic path towards the substrate during an exposure period;

chromatically separating the narrow wavelength band into at least two wavelength sub-bands, the first wavelength sub-band being smaller than the narrow wavelength band and centered about a first sub-band wavelength and the second wavelength sub-band being smaller than the narrow wavelength band and centered about a second sub-band wavelength;

passing each of the first sub-band and the second sub-band during distinct time periods within the exposure period;

focusing an image of a patterned mask onto the photosensitive material with a lens having chromatic aberration characteristics that provide for:
  focusing the image of the patterned mask at the low level when the first wavelength band is passed through the wavelength modulation system; and
  focusing the image of the patterned mask at the high level when the second wavelength band is passed through the wavelength modulation system.

11. The method of claim 10, wherein the chromatic aberration characteristic results in deviation of 200 nm to 500 nm in the level at which the lens focuses the image of the patterned mask as a result of a 1 pm wavelength deviation of the illumination.

12. The method of claim 11, wherein:
wherein the step of passing each of the first sub-band and the second sub-band during distinct time periods within the exposure period comprises varying the sub-band passed between the first sub-band and the second sub-band in a continuous function repeating at a frequency on the order of one kilohertz.

13. The method of claim 12, wherein the illumination within the narrow wavelength band is pulsed laser illumination pulsed at a frequency that is a multiple of the frequency of the continuous function.

14. The method of claim 13, wherein the narrow wavelength band has a width on the order of 1 Pico-meter.

15. The method of claim 14, wherein:
the steps of chromatically separating the narrow wavelength band and passing each of the first sub-band and the second sub-band during distinct time periods within the exposure period occurs prior to a step of passing each sub-band through a patterned mask.

16. The method of claim 15, wherein the step of chromatically separating the narrow wavelength band and passing each of the first sub-band and the second sub-band during distinct time periods within the exposure period comprises directing the narrow wavelength band towards a diffraction grating that rotates about an axis defined by the optic path.

17. The method of claim 15, wherein the step of chromatically separating the narrow wavelength band and passing each of the first sub-band and the second sub-band during distinct time periods within the exposure period comprises directing the narrow wavelength band towards a photo elastic crystal and propagating sound waves through the crystal in a direction oblique to the optic path.

18. The method of claim 15, wherein the step of chromatically separating the narrow wavelength band and passing each of the first sub-band and the second sub-band during distinct time periods within the exposure period comprises directing the narrow wavelength band towards a prism with at least one of an entry surface and an exist surface that is oblique to the optic path for separating the first sub-band from the second sub-band and moving the prism to vary the alignment of the first wavelength band and the second wavelength band at the exit surface with the optic path.

* * * * *